(12) United States Patent
Even et al.

(10) Patent No.: US 9,678,127 B2
(45) Date of Patent: Jun. 13, 2017

(54) FLEXIBLE SHIELDED ANTENNA ARRAY FOR RADIATED WIRELESS TEST

(71) Applicant: Ixia, Calabasas, CA (US)

(72) Inventors: Dov Even, Lake Oswego, OR (US); Lester Noel Stott, Aloha, OR (US)

(73) Assignee: Ixia, Calabasas, CA (US)

(*) Notice: Subject to any disclaimer, the term of this patent is extended or adjusted under 35 U.S.C. 154(b) by 345 days.

(21) Appl. No.: 14/308,676

(22) Filed: Jun. 18, 2014

(65) Prior Publication Data

US 2015/0369851 A1 Dec. 24, 2015

(51) Int. Cl.
*G01R 29/10* (2006.01)
*H01Q 1/52* (2006.01)
*G01R 29/08* (2006.01)

(52) U.S. Cl.
CPC ....... *G01R 29/105* (2013.01); *G01R 29/0878* (2013.01); *H01Q 1/526* (2013.01)

(58) Field of Classification Search
CPC ................ H01Q 1/526; G01R 29/0835; G01R 29/290878; G01R 29/105
See application file for complete search history.

(56) References Cited

U.S. PATENT DOCUMENTS

| 4,134,119 A * | 1/1979 | Sandoz | H01Q 1/282 343/703 |
| 6,606,064 B1 * | 8/2003 | Lusterman | G01R 29/0878 343/700 MS |

* cited by examiner

*Primary Examiner* — Robert Karacsony
*Assistant Examiner* — Amal Patel
(74) *Attorney, Agent, or Firm* — Jenkins, Wilson, Taylor & Hunt, P.A.

(57) ABSTRACT

Systems and methods are disclosed herein to provide shielding and radio frequency (RF) antenna coupling for communication test systems for the testing of wireless data communication devices and systems, including Multiple Input Multiple Output (MIMO) devices and systems. In accordance with one or more embodiments, a shielding and coupling system containing an array of RF antennas is disclosed that includes a flexible jacket integrated with RF shielding material that simultaneously isolates a device under test (DUT) and couples signals from the antennas of the DUT. Such a system may offer improved capabilities such as a faster and more efficient method of isolating the DUT from external interference, a more repeatable and simplified method of transmitting and receiving MIMO RF signals from DUTs having built-in antennas, and a more portable and lower cost RF test setup.

20 Claims, 10 Drawing Sheets

FLEXIBLE SHIELDED ANTENNA ARRAY FOR RADIATED WIRELESS TEST

TECHNICAL FIELD

The subject matter described herein relates generally to the test and measurement of wireless data communication systems; and more particularly to systems and methods for testing RF devices and systems with built-in or non-detachable antennas; including, but not limited to, multiple-input multiple-output data communication devices and systems.

BACKGROUND

Sophisticated wireless data communications devices, systems and networks, such as cellular telephones and wireless LAN transceivers, are in widespread use worldwide. There is increasing need for higher data rates and the support of an increased number of users and data traffic, and these networks employ complex signal waveforms and advanced radio frequency capabilities such as multiple-input multiple-output (MIMO) signal coding for achieving higher bandwidths. Further, the rapidly decreasing physical size and power consumption of these devices and systems cause them to become ever more highly integrated, with internal antennas and fully sealed construction. All of these techniques, however, increase the complexity of the wireless devices. Manufacturers, vendors and users therefore have a greater need for better testing of such systems.

Unfortunately, the complexity of wireless data communication devices and systems makes them particularly problematic to test due to the difficulty of accessing their internally integrated antennas, isolating them from external interference, and controlling the coupling between the wireless device and the test equipment. Actual open-air RF environments contain high levels of uncontrollable noise and interference, and also present time-varying and unpredictable channel statistics. However, external noise and interference have significant impact on device performance. The lack of controllability and repeatability also makes it difficult or impossible to automate the testing of such wireless systems. Therefore, it is very attractive to manufacturers and users to test these devices in a repeatable fashion by excluding the interference and variability of real RF environments and also controlling the degree of coupling between the wireless device and the test equipment. This also enables the tests to be conducted in an automated fashion, or by personnel not highly skilled in RF channel characteristics.

Traditional methods of isolating and coupling to wireless communications devices include: anechoic and reverberation chambers; shielded enclosures of various sizes; cabled connection to device antenna connectors or antennas; use of antenna ranges; and operation in open air environments. All of these methods exhibit one or more deficiencies when considering the requirements of modern MIMO wireless devices. Anechoic and reverberation chambers are very expensive, bulky and fixed at one location due to their large size and weight. Shielded enclosures offer limited portability but are still relatively expensive and heavy, and suffer from repeatability issues. Further, small shielded enclosures present many problems when dealing with MIMO systems. Cabled connections to the wireless device under test are simple and offer very high repeatability and low cost, but are unfortunately impractical or impossible with modern highly integrated compact devices such as cellular telephones. Outdoor antenna ranges are expensive and difficult to find, due to their real estate requirements, and further have problems when dealing with MIMO transmission. Open air environments are highly variable, nearly impossible to reproduce, and present significant challenges with repeatability and controllability. All of these problems are exacerbated when considering the trend in modern wireless devices of incorporating multiple antennas that are integrated into the device, non-detachable, and with a high degree of impact on device performance.

The known methods in the field of wireless device testing therefore suffers from serious shortcomings with regard to isolating and coupling to a device under test. There is hence a need for improved wireless data communication test systems and methods. A system that is inexpensive, highly portable, and capable of handling devices with integrated non-detachable antennas is desirable. It is preferable for such a system to provide shielding of the device under test from external interference, as well as coupling of radio frequency signals between the device under test and the test equipment. Further, such a system should allow repeatable coupling to device antennas without special jigs or expensive fittings, even though the device antennas may be located internally and not visible in normal operation. Finally, the system should present simplified use and operation to permit less skilled personnel to conduct testing of advanced wireless devices, and should also accommodate wireless devices of different sizes and shapes without modification.

SUMMARY

A combined shielding and coupling system for isolating and coupling to a wireless device under test is provided. The system includes a flexible jacket including a radio frequency shielding layer for enclosing at least a portion of a device under test, and electromagnetically shielding the device under test. An antenna mounted in or on the jacket resides within an enclosure formed by the jacket and couples with an antenna of the device under test. A connector is provided for connecting the antenna mounted in or on the jacket with a test system.

The test system described herein may be implemented in hardware, software, firmware, or any combination thereof. As such, the terms "function" "node" or "module" as used herein refer to hardware, which may also include software and/or firmware components, for implementing the feature being described. In one exemplary implementation, the test system described herein may be implemented using a computer readable medium having stored thereon computer executable instructions that when executed by the processor of a computer control the computer to perform steps. Exemplary computer readable media suitable for implementing the test system described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

Figure 1:
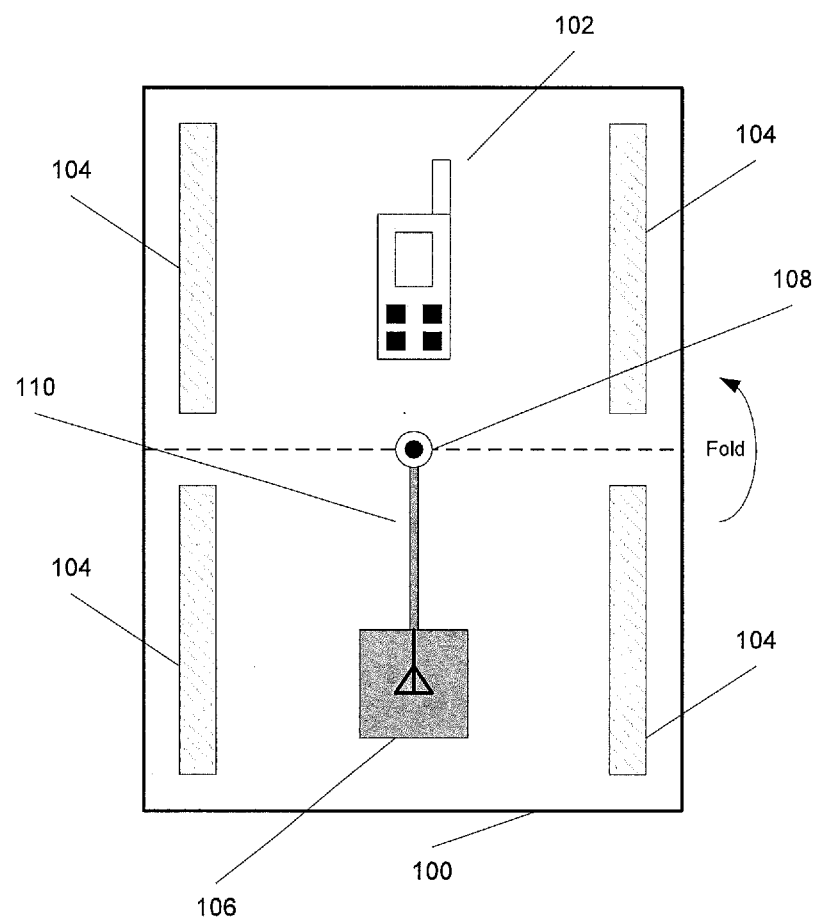
FIG. 1 is a plan view of a shield jacket with a single antenna cabled to the test equipment and showing placement of DUT according to an embodiment of the subject matter described herein.

The subject matter described herein includes a foldable shield jacket for surrounding RF components of a DUT while allowing those components to communicate with a test device. FIG. 1 shows a plan view of a flat flexible jacket 100 with an integral RF shielding layer that may be folded and secured over a wireless device under test (DUT) 102 to isolate it from external RF interference. Jacket 100 may be secured with temporarily adhesive strips 104, such as Velcro. DUT 102 may be placed at a predefined location on jacket 100 before jacket 100 is folded over and secured. A wireless antenna 106 is integrated onto the inner surface of shield jacket 102 to couple RF signals to and from the DUT antenna. Jacket antenna 106 may be connected to an RF connector 108 (such as a standard microwave subminiature version A (SMA) connector) by a short length of flexible RF cable 110. Both connector 108 and cable 110 may be also permanently attached to shield jacket 100.

In FIG. 1, jacket 100 is represented for exemplary purposes as being rectangular in shape and foldable about a center line of jacket 100. In an alternate implementation, jacket 100 may be made of other geometric shapes, such as square or circular shapes. Any foldable regular or irregular polygonal shape for jacket 100 is intended to be within the scope of the subject matter described herein.

Figure 2:
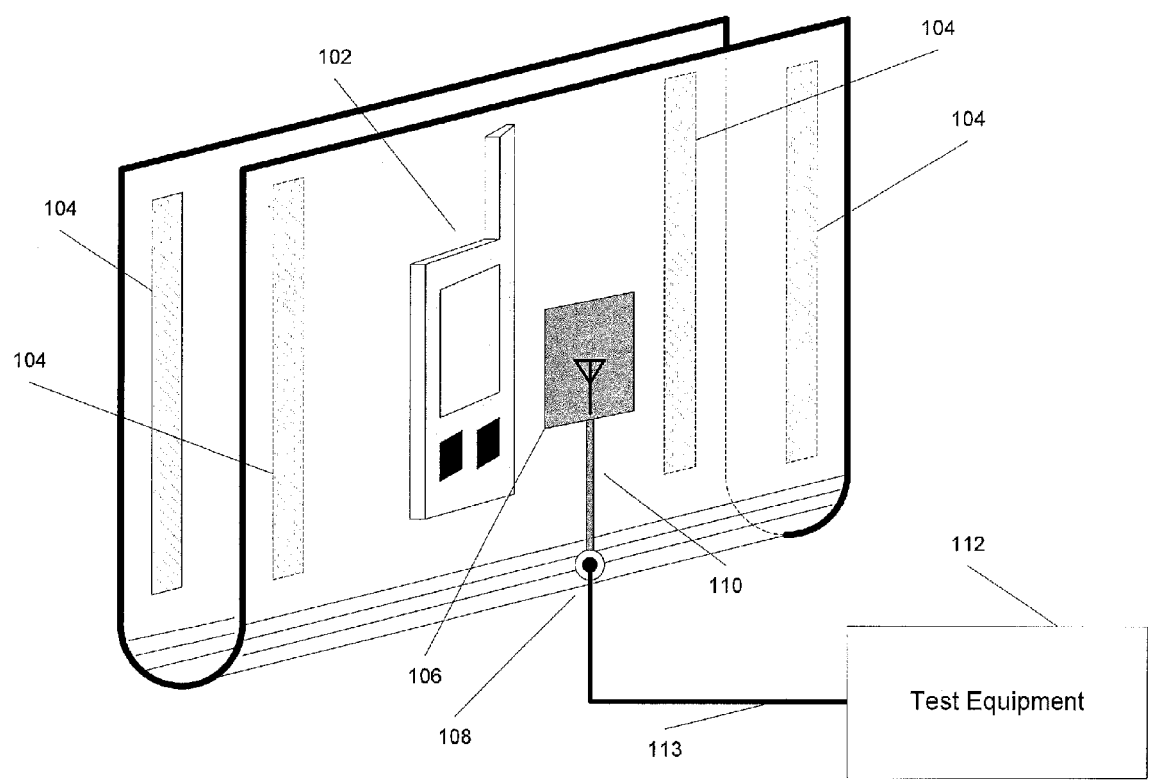
FIG. 2 is a view of shield jacket folded over a DUT and secured according to an embodiment of the subject matter described herein.

FIG. 2 shows an isometric view of flexible jacket 100 after being folded over the DUT 102 and secured with Velcro strips 104. Antenna 106 integrated into jacket 100 as well as flexible RF cable 110 and connector 108 are also shown. External test equipment 112 may be connected to RF connector 108 mounted on shield jacket 100 via RF cables 113. Test equipment 112 can exchange RF signals with DUT 102 as shield jacket antenna 106 is electrically coupled to the DUT antenna(s). The close proximity of shield jacket antenna 106 to the DUT antenna(s) may cause the efficiency of coupling to be quite high, while the fact that DUT 102 is fully enclosed within shield jacket 100 may cause a significant amount of reduction in external interference.

Figure 3:
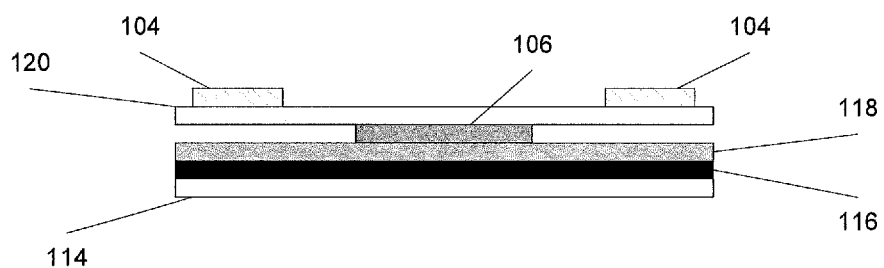
FIG. 3 is a diagram of layers comprising shield jacket according to an embodiment of the subject matter described herein.

FIG. 3 shows a cross-section of a possible implementation of shield jacket 100. Shield jacket 100 comprises an outer layer 114 of insulating material such as polyester or any other flexible plastic or cloth. Outer layer 114 should be sufficiently durable to resist normal wear and tear. A metallic or metallized polymer RF shield layer 116 is then attached to outer layer 114, and on top of shield layer 116 is attached dielectric layer 118, such as polyester laminated with dielectric foam. Wireless antenna 106 integrated into jacket 100 is mounted on top of dielectric layer 118; dielectric layer 118 improves the electrical performance of antenna 106 and separates and isolates antenna 106 from RF shield layer 116 (which acts as an extended ground plane for the antenna). An inner layer 120 of insulating material (again, polyester or other flexible cloth) is mounted above antenna 106 and dielectric layer 118. Velcro strips 104 are then attached to inner insulating layer 120. The whole ensemble may be sewn together or otherwise permanently attached so as to form a flat sheet that can be folded along a predefined line. Note that RF connector 108 and flexible RF cable 110 connecting the RF connector 108 to the shield jacket antenna 106 are normally also attached to shield jacket 100 by stitching, and RF shield layer 116 is grounded to the body of connector 108. RF connector 108 is mounted such that when shield jacket 100 is folded, connector 108 appears on the outside in a position suitable for connecting to the test equipment.

Figure 4:
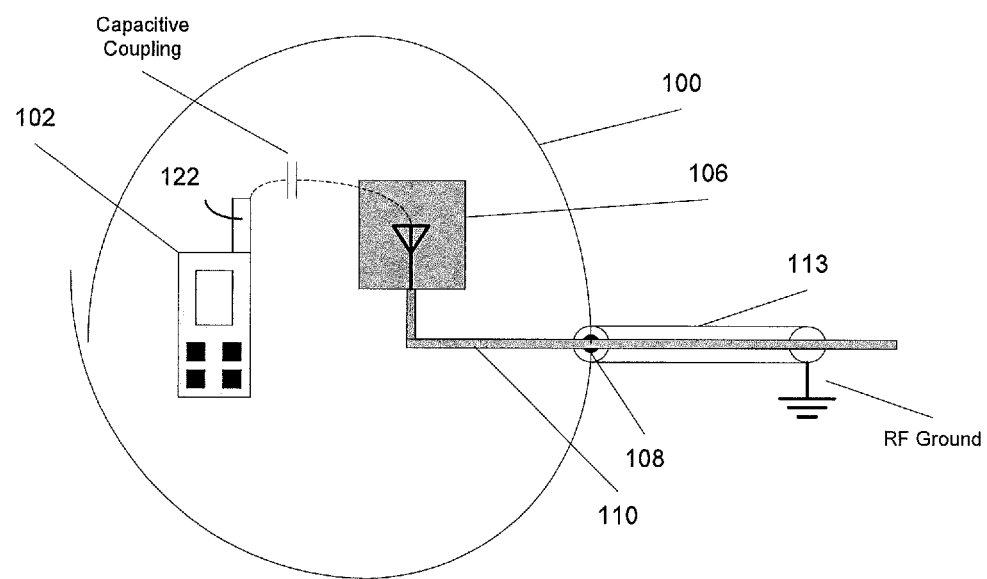
FIG. 4 is an electrical circuit diagram of a DUT with an internal antenna and coupling to a jacket antenna, and showing shield as well according to an embodiment of the subject matter described herein.

FIG. 4 depicts an equivalent electrical model of the shield jacket and DUT mechanical arrangement shown in FIG. 1 and FIG. 2. As shown, shield jacket antenna 106 is very close to DUT antenna 122, so coupling is usually mainly capacitive (or inductive in rare cases). The close proximity of antennas 106 and 122 means that the coupling coefficient is very high, and RF signal transfer is quite efficient. RF shielding layer 116 enclosed within the inner and outer polyester layers 120 and 114 acts as a nearly continuous electromagnetic shield completely surrounding DUT 102; as such, this may perform a similar function to a shielded enclosure, but at a significant reduction in weight, size and cost. The shielding effectiveness of shield jacket 100 is necessarily lower than that of a good quality enclosure, but in most cases this is not a significant issue because of the greatly improved coupling efficiency. RF shield layer 116 is electrically bonded to connector 108 and thus forms an extension of the coaxial cable shield of RF cable 113 used to connect to test equipment 112.

Some considerations and alternatives of the arrangement shown in FIG. 1 may be covered here. FIG. 1 shows the jacket 100 as being a flat sheet that is folded over the DUT 102; however, the jacket may also be constructed in the form of a pocket or pouch into which DUT 102 is placed, optionally with a flap that is folded over to complete the RF shield around the DUT. Electrically bonding shield layer 116 to itself at the edges of the pouch or pocket may improve the shielding effectiveness of jacket 100 in this configuration. Jacket 100 may be constructed from layers of flexible non-conductive fabric and metallized or metallic sheet (e.g., metallized Mylar), and additional layers of fabric may be provided to cover the cabling and antennas to provide for a more pleasing appearance. Further, logos or other pictorial representations may be sewn on to the fabric or stenciled or painted on its surface. DUT 102 is generally assumed to be battery powered; however, power cables or non-RF test wires to DUT 102 may be accommodated by leading these wires in through the corners or sides of jacket 100. Test antenna 106 mounted on shield jacket 100 may be of any compact type, such as a surface-mount chip-style antenna, a small PCB substrate with etched traces, or compact wire/cylinder styles.

The multiple laminated layers comprising jacket 100 provide for a certain stiffness, even though the overall construction is flexible. As a consequence, after jacket 100 is folded over DUT 102 and held securely with Velcro strips 104, DUT 102 remains in an approximately fixed position relative to antenna 106 of shield jacket 100, even with some limited handling. Inner layer 120 may be given a non-slip surface treatment to further prevent DUT 102 from moving about within jacket 100. As a consequence, the coupling between DUT 102 and shield jacket antenna 106 is held constant and repeatable even without the use of mounting jigs. To further facilitate this, a DUT outline (or key reference points) may be marked on inner layer 120 of the shield jacket 100 to allow repeatable placement of the same or different DUTs 102 within the jacket.

As previously mentioned, shield jacket antenna 106 is physically close to the DUT antenna(s) 122, thereby increasing the efficiency of coupling. This is true even with DUTs 102 having integral antenna(s) 122; such DUTs 102 are difficult to deal with in shielded enclosures without special mounting jigs or precautions. If DUT 102 is capable of operating on multiple wireless bands, or implements multiple wireless protocols (such as wireless LAN and Bluetooth), a multiband antenna can be used in shield jacket 100 to enable all of the frequency bands and wireless protocols to be tested.

It may be apparent that this system is very inexpensive and far lighter and more portable than anechoic chambers or shielded enclosures, while still offering the benefits of enhanced RF isolation and consistent and repeatable signal coupling. In particular it may be apparent that this system can be used without special setup or infrastructure requirements, and it will be readily clear to personnel not trained in RF techniques as to how to position and secure the DUT 102 within jacket 100 and connect it to test equipment 112.

Figure 5:
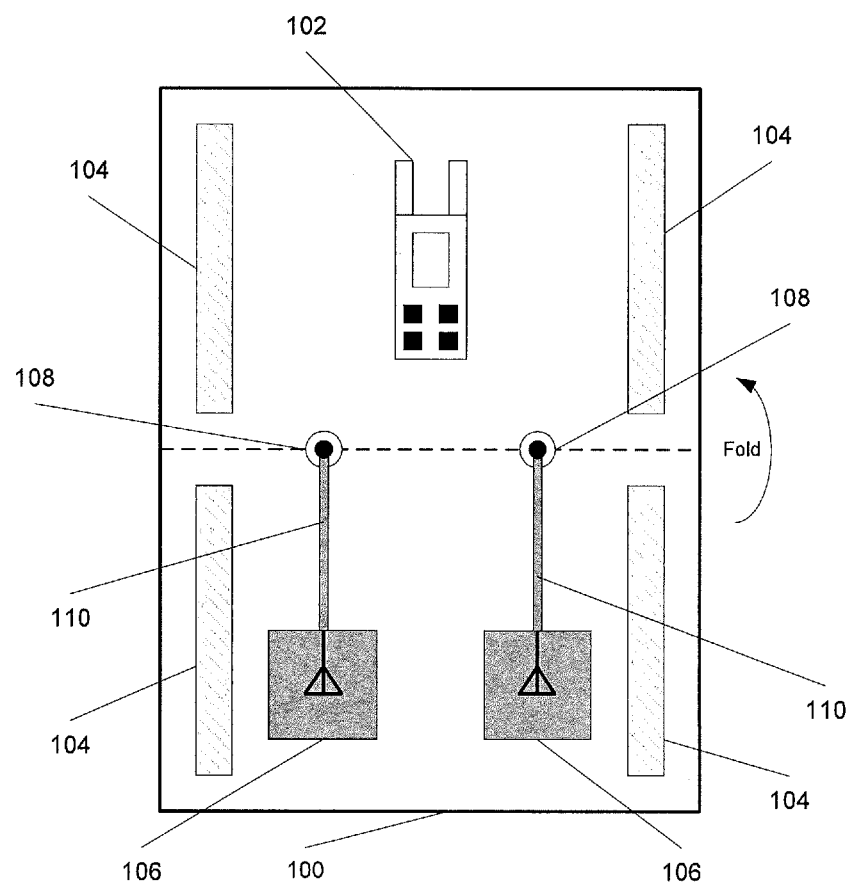
FIG. 5 is an outline diagram of jacket with 2 antennas for 2×2 MIMO according to an embodiment of the subject matter described herein.

FIG. 5 shows a shield jacket system that can be used to test MIMO DUTs. Shield jacket 100 illustrated in FIG. 5 comprises the standard elements of the single-antenna shield jacket system depicted in FIG. 1, but incorporates two (or more) antennas 106 rather than a single antenna 106. Each antenna 106 is connected to a separate RF connector 108 via a separate run of flexible RF cable 110. The multiple antennas 106 in shield jacket 100 couple to the multiple antennas 122 of DUT 102. The geometry of the system and the placement of DUT 102 at the center of the shield jacket system ensures that differential coupling exists between different pairs of DUT antennas 106 and shield jacket antennas. The operation of the remainder of the system is identical to that of the single-antenna case.

It may not be necessary for careful placement of DUT antennas 122 with respect to shield jacket antennas 106. As noted above, differential coupling is created by physical separation of shield jacket antennas 106, and this differential coupling effectively sets up a MIMO channel model between shield jacket antennas 106 and DUT antennas 122. While this MIMO channel model does not resemble the normal MIMO channel in an open-air environment containing scatterers, it is nevertheless sufficient to allow MIMO transmission to occur and multiple parallel streams of data to be exchanged between DUT 102 and the test equipment 112.

One benefit of the arrangement in FIG. 5 is that MIMO DUTs with integral antennas can be simply and easily tested. There may be a substantial reduction in cost and size over standard MIMO enclosures or chambers. Repeatability may be ensured by placing the DUT on the same location in the shield jacket before folding over and securing it. This aligns the DUT antennas in the same position relative to the shield jacket antennas, and sets up substantially the same MIMO channel model each time the system is set up and used.

Figure 6:
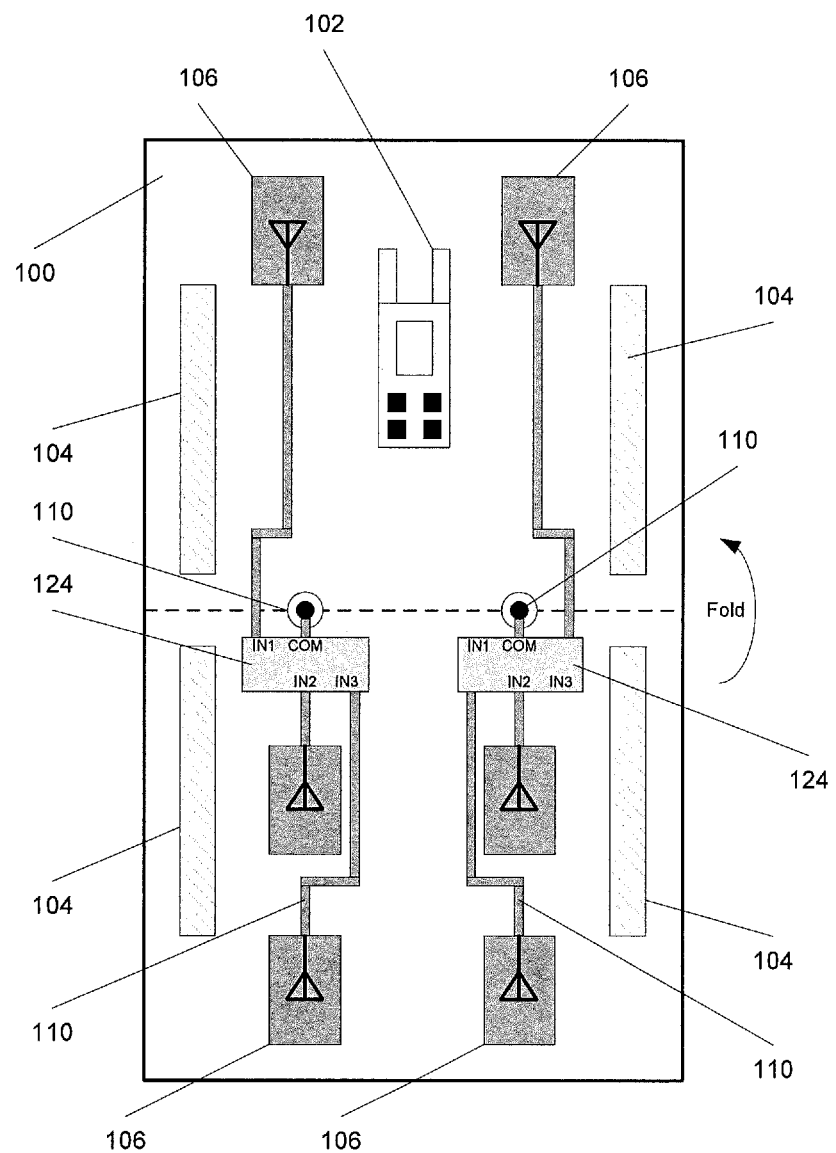
FIG. 6 is an outline diagram of jacket with 6 antennas in a regular pattern, plus dividers according to an embodiment of the subject matter described herein.

FIG. 6 shows an enhancement of the system of FIG. 5, where additional antennas are embedded into the shield jacket 100 and combined into a single system using power dividers 124. Each block of additional antennas 106 acts electrically as a single antenna, as the signals from all of the antennas are additively combined (or signals injected into the power dividers 124 are linearly split among antennas 106). As in the case of FIG. 1 and FIG. 5, there may be either one block of additional antennas 106 (for a SISO system) or multiple blocks (for a MIMO system). The number of MIMO spatial streams supported may be determined by the number of separate blocks of antennas 106.

The arrangement in FIG. 6 has the benefit that there is a shield jacket antenna 106 in close proximity to one of the internal antennas 122 in DUT 102, regardless of where an antenna 122 may actually be physically integrated into the DUT. This enhances coupling to DUT 102 without necessitating the precise placement of the DUT within the shield jacket, or even determining where DUT antennas 122 are located with respect to the DUT geometry. The use of power dividers 124 ensures that the overall system impedance is maintained regardless of the number of additional antennas employed; the power split among the shield jacket antennas 106 results in a small loss of efficiency, but this is compensated for by the increase in coupling efficiency by having at least one shield jacket antenna 106 in closer proximity to a DUT antenna 122. SMA connectors 108 for connecting to test equipment 112 may be rigidly mounted on power dividers 124, or may be separately mounted on jacket 100 and one or more flexible cables 110 used to connect connectors 108 to power dividers 124.

The benefits of the arrangement of FIG. 6 are readily observed. Larger DUTs 102 may be accommodated by enlarging jacket 100 and spreading out the additional antennas across the inner surface of jacket 100, without losing efficiency due to an increased distance between DUT 102 and shield jacket antennas 106. The need for precise placement of DUT 102 within shield jacket 100 may be obviated. Any number of antennas 106 may be included in shield jacket 100, organized as any number of groups/blocks; the number of antennas within each group improves the coupling to the DUT, while the number of groups/blocks increases the number of MIMO spatial streams that can be handled.

Figure 7:
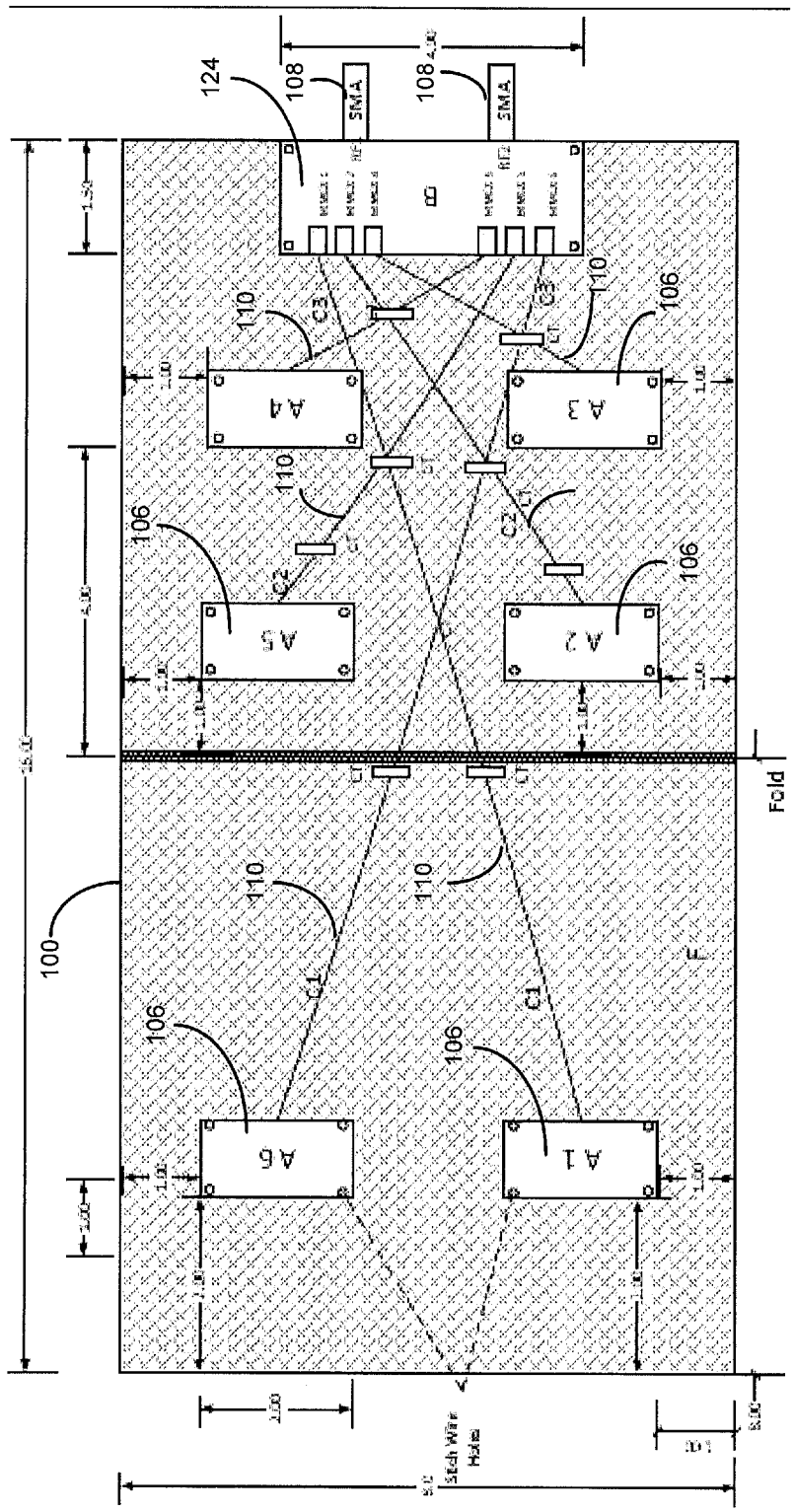
FIG. 7 is a mechanical diagram of jacket (top view) according to an embodiment of the subject matter described herein.

FIG. 7 shows the top view of a typical mechanical drawing for shield jacket 100 and antenna array 106. The shield jacket fabric may have antennas 106 sewn between the outer and inner layers of fabric (as depicted in FIG. 3). A dual power divider 124 may also be sewn to the fabric; this power divider 124 integrates the two separate power dividers shown in FIG. 6 into a single housing, but is otherwise electrically similar. C1, C2, C3 are flexible SMA cables 110 connecting the antennas 106 to power divider 124, and may be secured to the jacket fabric by stitching. The test equipment is connected to SMA connectors 108 on the right.

Figure 8:
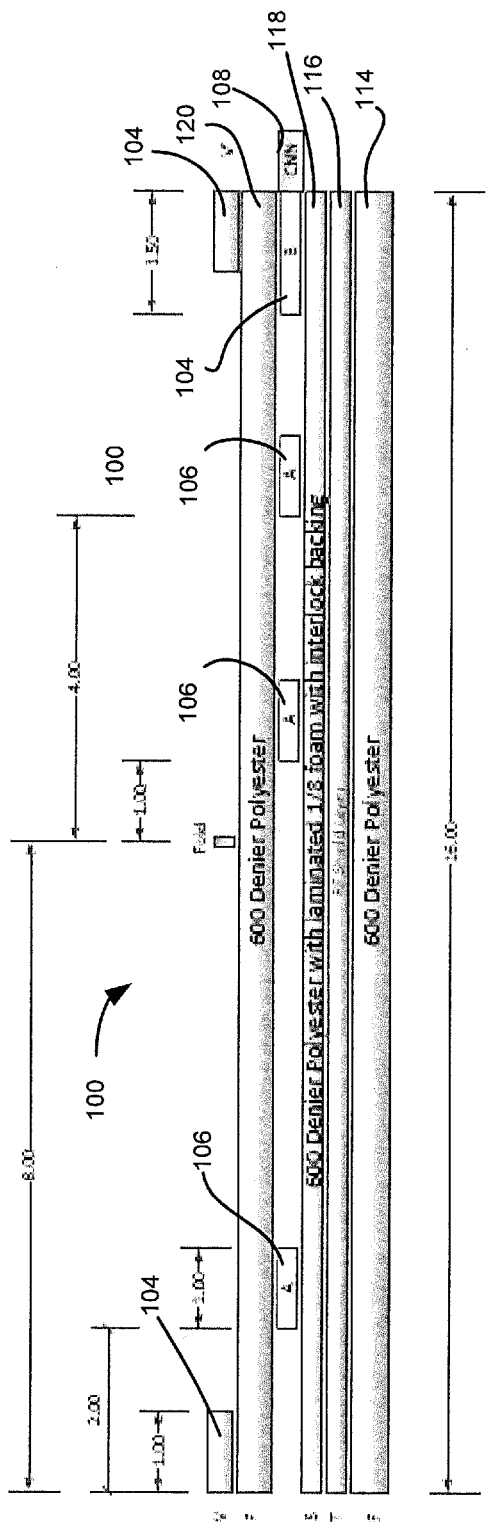
FIG. 8 is a mechanical diagram of jacket (side view) according to an embodiment of the subject matter described herein.

FIG. 8 is a mechanical drawing of shield jacket fabric layers made of polyester, with Velcro strips 104 used to secure the jacket around the DUT. Polyester layers 118 and 120 sandwich antennas 106 (which may be small 'chip' style or 'PCB' style multiband antennas), which are mounted on a polyester backing layer 118 with laminated foam. RF shield layer 116 is placed between backing layer 118 and outside polyester fabric layer 118, so that it is separated from antennas 106 with a dielectric medium. The whole arrangement may be sewn together to create a durable system that facilitates repeatable DUT placement and removal, and can be folded a number of times without losing mechanical or electrical integrity.

Figure 9:
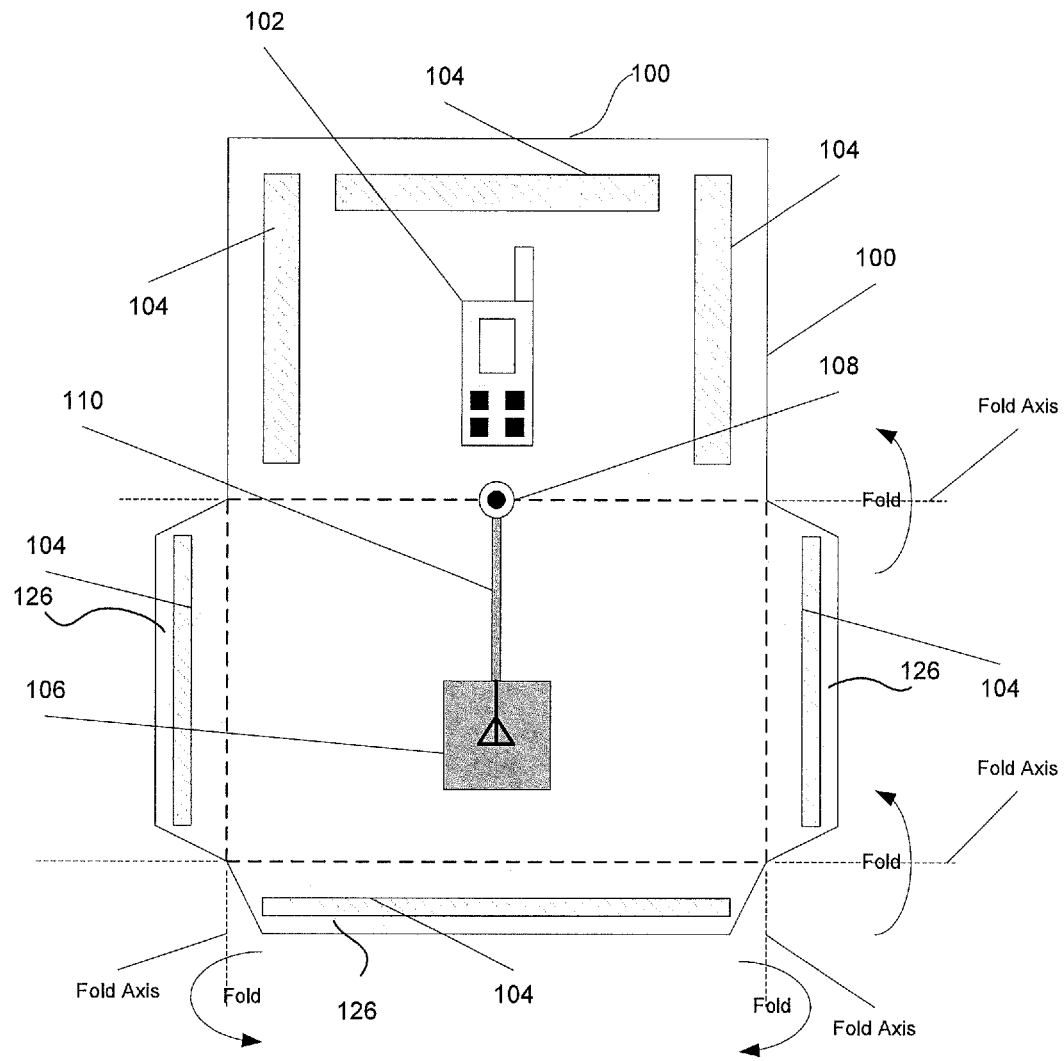
FIG. 9 is a diagram of waveguide below cutoff side flaps according to an embodiment of the subject matter described herein.

FIG. 9 shows an arrangement for further isolating DUT 102 and reducing the impact of external RF interference, employing the concept of a 'waveguide below cutoff'. This arrangement makes use of the fact that a slot or hole in an otherwise continuous metallic layer is opaque to RF radiation if the width of the slot or radius of the hole is substantially less than one wavelength. Thus the isolating effect is that of an unbroken metallic sheet. The effect of the waveguide below cutoff is created by providing the shield jacket with a set of flaps 126 located on one half of the jacket. After the jacket is folded in half over the DUT along the main fold, flaps 126 are in turn folded over the other half. By extending the RF shield into the flaps as an electrically continuous conductive layer, RF shield layer 116 is caused to overlap with itself for at least a half wavelength. The effect caused thereby resembles a waveguide below cutoff, and excludes external RF radiation from entering the inside of folded shield jacket 100 and affecting DUT 102. In order for this to function, RF shield layer 116 must be electrically continuous into folded flaps 126, and the polyester and foam insulating layers must be sufficiently thin.

Many other embodiments and applications of this arrangement may be apparent to persons skilled in the art. Jacket 100 may be unfolded and placed within a conventional shielded enclosure or anechoic chamber, potentially being attached to the wall of the chamber with the antennas pointing inwards, to serve as an antenna array. In another embodiment, small holes may be created in the polyester fabric and RF shield layer 116 for power dissipation, in order to deal with DUTs that need cooling airflow for normal operation; if each individual hole is well below 1 wavelength, the RF shielding properties will not be impaired. The holes in the jacket may be considered thermal cooling provisions or features in the jacket for thermally cooling the device under test. In yet another embodiment, a power cord and filter may be sewn into the shield jacket to supply operating power to DUTs if required; for example, if the battery capacity of the DUT is insufficient, or the DUT is not battery powered at all. In still another embodiment, the shield jacket may be cut and formed into different shapes (e.g., pouches, bags, wrappings) to accommodate the requirements of thick or oddly shaped DUTs. Another embodiment may include shield jacket antennas that are oriented in different directions to accommodate different polarizations of DUT antennas.

Figure 10:
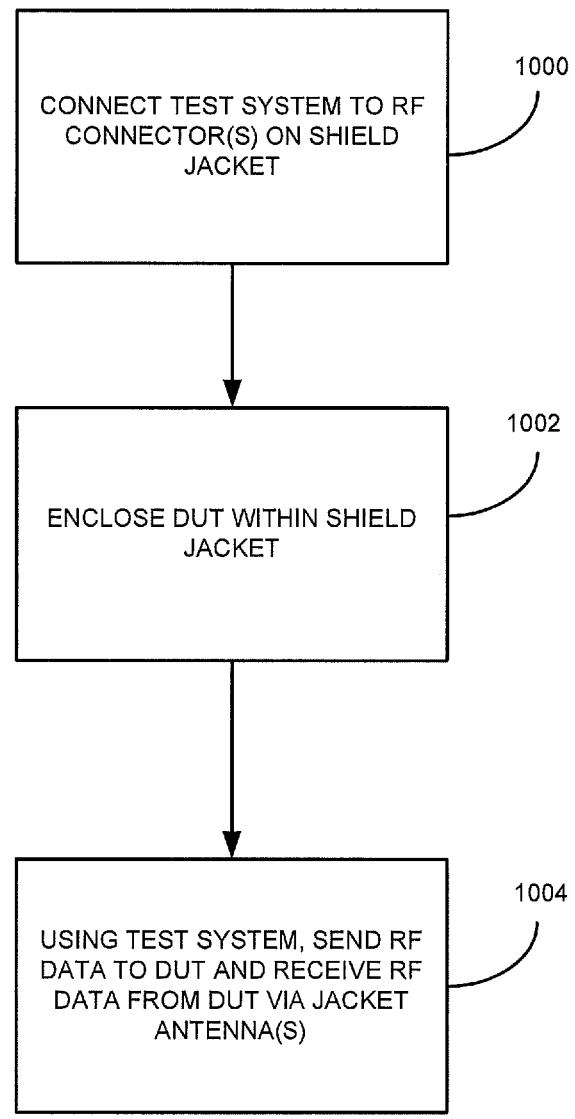
FIG. 10 is a flow chart illustrating an exemplary process for testing a device using a shield jacket according to an embodiment of the subject matter described herein.

FIG. 10 is a flow chart illustrating an exemplary process for testing a DUT using jacket 100 according to an embodiment of the subject matter described herein. Referring to FIG. 10, at step 1000, test system 112 is connected to RF connector 108 of jacket 100. The connection would typically be via an RF cable 113. At step 1002 the DUT is enclosed within shield jacket 100. As stated above, the enclosing may be achieved through folding or wrapping of jacket 100 around DUT 102 or placing DUT 102 in a pocket formed by jacket 100. At step 1004, test system 112 transmits RF data to and receives RF data from DUT 102 while DUT 102 is shielded by jacket 100.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A combined shielding and coupling system for isolating and coupling to a wireless device under test (DUT) including at least one antenna, the system comprising:
   a flat flexible jacket including a radio-frequency shielding layer for enclosing the at least one antenna of the DUT and electromagnetically shielding the DUT, the flat flexible jacket being foldable to cover the at least one antenna of the device under test;
   an antenna mounted in or on the jacket for residing within an enclosure formed by the jacket and coupling with the at least one antenna of the DUT; and
   a connector for connecting the antenna mounted in or on the jacket with a test system.

2. The system of claim 1, wherein the jacket is foldable along at least one axis to enclose at least a portion of the DUT.

3. The system of claim 1, wherein the jacket forms a pocket for receiving the DUT.

4. The system of claim 1, further comprising a plurality of antennas mounted in or on the jacket for multiple input multiple output (MIMO) communication with the DUT.

5. The system of claim 1, wherein the jacket includes a plurality of antennas that are combined into a single signal path.

6. The system of claim 1, wherein the jacket includes a plurality of antennas divided into a plurality of groups, all antennas in one group being combined into a single signal path.

7. The system of claim 1, wherein the radio-frequency shielding layer includes flaps extending from sides of a first half of the flexible jacket.

8. The system of claim 7, wherein said flaps are foldable over sides of a second half of the flexible jacket when the flexible jacket is folded such that the first half is adjacent to the second half.

9. The system of claim 1, wherein the jacket includes DUT power supply provisions.

10. The system of claim 1, wherein the jacket includes thermal cooling provisions.

11. A method for shielding and testing a wireless device under test including at least one antenna, the method comprising:
    connecting a test system to a connector on a flat flexible jacket including a radio frequency shielding layer and an antenna mounted in or on the jacket;
    enclosing the at least one antenna of the device under test within the jacket, wherein enclosing the at least one antenna in the jacket including folding the flat flexible jacket to cover the at least one antenna of the device under test; and
    wirelessly transmitting data from the antenna mounted in or on the jacket to the at least one antenna device under test.

12. The method of claim 11, wherein enclosing at least a portion of the device under test within the jacket includes folding the jacket to enclose the device under test.

13. The method of claim 11, wherein enclosing at least a portion of the device under test with the jacket includes placing the device under test in a pocket formed by the jacket.

14. The method of claim 11, wherein the jacket includes a plurality of antennas mounted in or on the jacket for multiple input multiple output (MIMO) communication, and wherein wirelessly transmitting data to and receiving data from the device under test includes transmitting and receiving the data using MIMO communications.

15. The method of claim 11, wherein the jacket includes a plurality of antennas mounted in or on the jacket, and the antennas are combined into a single signal path.

16. The method of claim 11, wherein the jacket includes a plurality of antennas mounted in or on the jacket and that are divided into a plurality of groups, all antennas in one group being combined to form a single signal path.

17. The method of claim 11, wherein the radio-frequency shielding layer includes flaps extending from sides of a first half of the flexible jacket.

18. The method of claim 17, wherein said flaps are foldable over sides of a second half of the flexible jacket when the flexible jacket is folded such that the first half is adjacent to the second half.

19. The method of claim 11, further including powering said device under test using a power supply connection accessible by the device under test through the jacket.

20. The method of claim 11, further comprising thermally cooling the device under test using features in the jacket.

\* \* \* \* \*